United States Patent [19]

Porterfield et al.

[11] Patent Number: 4,887,351

[45] Date of Patent: Dec. 19, 1989

[54] PICK AND PLACE NOZZLE WITH CONCENTRIC GROOVES

[75] Inventors: Richard F. Porterfield, Binghamton, N.Y.; Douglas A. Biesecker, Clarks Summit, Pa.

[73] Assignee: Universal Instruments Corporation, Binghamton, N.Y.

[21] Appl. No.: 242,428

[22] Filed: Sep. 9, 1988

[51] Int. Cl.[4] .................... B25J 15/06; H05K 13/04
[52] U.S. Cl. ............................... 29/740; 29/743; 294/2; 294/64.1; 414/744.1
[58] Field of Search ............ 29/740, 743, 741, 759; 294/64.1, 2; 414/744 B

[56] References Cited

U.S. PATENT DOCUMENTS

| | | | |
|---|---|---|---|
| 4,728,135 | 3/1988 | Sugimura et al. | 294/64.1 |
| 4,762,354 | 8/1988 | Gfeller et al. | 29/743 X |
| 4,769,904 | 9/1988 | Porterfield et al. | 29/840 |

FOREIGN PATENT DOCUMENTS 3535610 4/1987 Fed. Rep. of Germany.

Primary Examiner—Carl E. Hall
Attorney, Agent, or Firm—Fidelman & Wolffe

[57] ABSTRACT

The present device is directed to a nozzle tip for the head of a pick and place device for arranging electronic components as desired on a substrate. The tip permits both first and second vacuum areas to be selectively generated, thus facilitating the pick-up of components of widely varying sizes and shapes with a single tip.

7 Claims, 1 Drawing Sheet

PICK AND PLACE NOZZLE WITH CONCENTRIC GROOVES

The present invention is directed to a pick and place nozzle for surface mounted semiconductor components and, more particularly, for a pick and place nozzle having two concentric vacuum members with differing vacuum characteristics for permitting the pick and place head to pick-up a wide range of sizes and configurations of semiconductor components.

BACKGROUND OF THE INVENTION

Conventional pick and place devices for mounting electronic components on a printed circuit board utilize a vacuum probe or head to pick-up the chip and place it at a selected position on the substrate. Such a typical device can be seen, for example, in U.S. Pat. No. 4,611,397, commonly-assigned herewith.

There is a disadvantage with such typical pick and place devices in that the nozzle tip formed on the lower end portion of the head can only pick-up a limited range of sizes and shapes of components. Thus, multiple nozzles or nozzle tips must be provided, changed via an off-line nozzle tip selector, to pick-up a wide range of components. This is an expensive and inefficient method of handling widely varying electronic components.

There is a further disadvantage with typical devices in that the pocket from which the chip is removed is much larger than the chip itself. Thus, when removing the chip, it is difficult to keep the chip from flipping on edge.

SUMMARY OF THE INVENTION

The present invention overcomes the above disadvantages by providing a single nozzle tip that facilitates pick-up of a wide range of sizes and configurations of electronic components. The device includes a nozzle body of a vacuum head spindle surrounding an inner sleeve. The inner sleeve has a hollow central bore forming a vacuum channel.

Attached to the lower end portion of the inner sleeve is a substantially funnel-shaped nozzle tip. A cushion is disposed between the nozzle body and the tip, thus forming a chamber between the cushion and the tip. This chamber corresponds to the large area vacuum portion. The inner diameter of the tip corresponds to the small area vacuum portion. At least one control orifice is formed in the tip wall for selectively generating a vacuum force in either the first or the second vacuum areas. In this way, a single nozzle can be used to pickup small, large or even off-center components for placement on a substrate. Moreover, the appropriate vacuum force aids in preventing the chip from flipping on edge.

BRIEF DESCRIPTION OF THE DRAWINGS

The above aspects of the present invention can be seen from the attached drawings, in which.

DETAILED DESCRIPTION OF THE PREFERRED EMBODIMENTS

Figure 1:
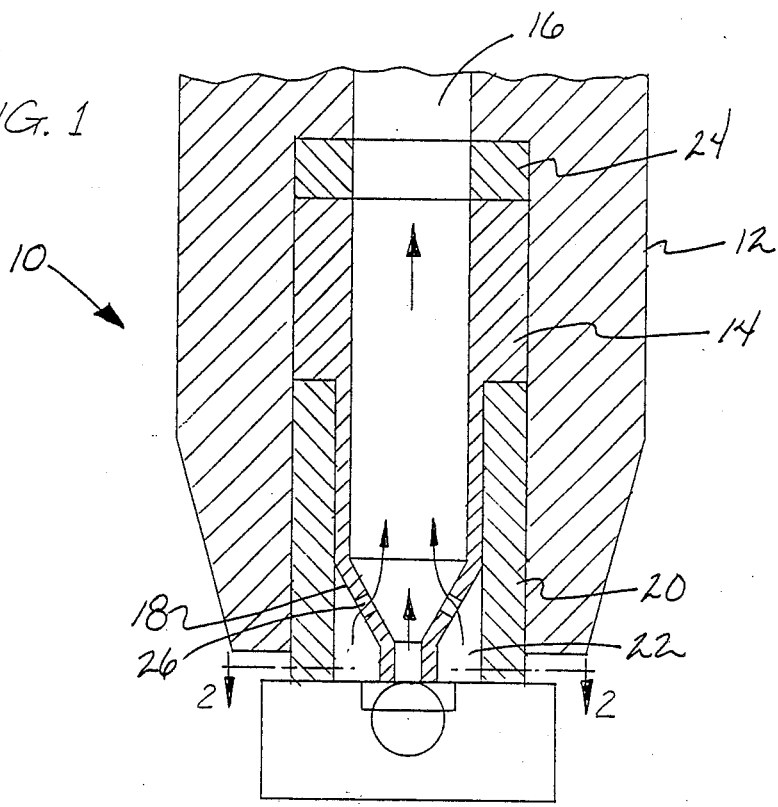
FIG. 1 is a front cross-sectional view of a nozzle for a pick and place device for semiconductor components according to a preferred embodiment of the present invention.

A spindle tip for a pick and place device, according to a preferred embodiment of the present invention, is illustrated in FIG. 1 and generally designated 10. In the figures, like numerals will be used to represent like elements.

Pick and place spindle 10 is movable in the X-, Y- and Z-planes in a conventional manner. The spindle 10 includes nozzle body 12 surrounding inner sleeve 14. Inner sleeve 14 includes a preferably central longitudinal bore 16 that serves as a vacuum channel. Bore 16 is coupled to a vacuum pump (not shown) in a conventional manner.

Nozzle tip 18 is coupled to the lower end portion of inner sleeve 14. The nozzle tip is preferably substantially funnel-shaped to form a first vacuum area A1 across the inner diameter thereof, as will be discussed in more detail below. Of course, any suitable shape that creates the desired area A1 may be used. The nozzle tip is also preferably removable for maintenance inspection or replacement.

Outer cushion 20 is disposed between the lower end portion of the nozzle body and the lower end portion of the nozzle tip, forming chamber 22 between the outer cushion and the nozzle tip, corresponding to large vacuum area A2, as will be discussed in more detail below. This outer cushion is preferably formed of a suitable elastomeric material that acts as a vacuum seal and as a cushion to protect the components from damage. The lower surfaces of both the nozzle tip and the outer cushion are preferably flat so that accurate pick and placement and sealing can be maintained.

Similarly, inner cushion 24 is disposed between the upper end portion of the inner sleeve and the nozzle body. Inner cushion 24 is preferably made of a material similar to that of outer cushion 20.

Figure 2:
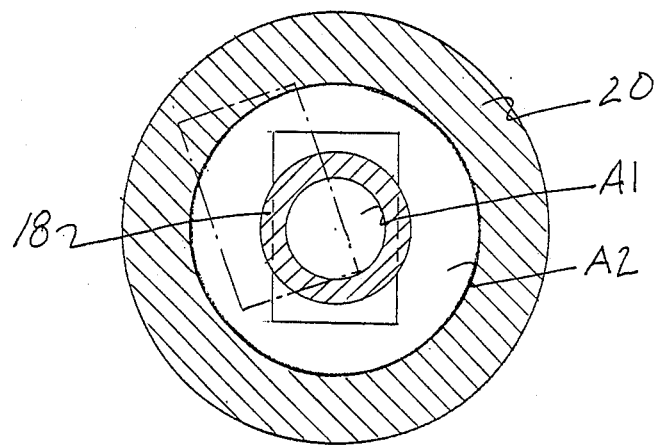
FIG. 2 is a cross-sectional view of the device shown in FIG. 1, taken along line 2—2.

At least one control opening 26 is formed in the nozzle tip, although two are shown in the preferred embodiment of FIG. 1. Control openings 26 permit a vacuum force to be selectively generated in either vacuum area A1, vacuum area A2 or both. In this way, small and/or cylindrical components or the like can be picked-up by the vacuum force generated in small vacuum area A1. Larger components can be picked-up by the vacuum force generated in large vacuum area A2. As can be seen in FIG. 2, even an off-center component can be picked-up via the vacuum force generated in both areas A1 and A2.

In operation, large components are secured to the nozzle tip by first sealing off vacuum area A2 before pick-up. Chamber 22 is then evacuated through control openings 26, thus producing a vacuum force in large vacuum area A2. Small components are secured to the nozzle tip by evacuating the nozzle tip through the vacuum channel, thus producing a vacuum force in small vacuum area A1. The component itself actually controls the vacuum pickup area, while the control openings minimize the vacuum leak. Further, the control openings provide a higher flow rate as the head is first lowered.

The foregoing is for illustrative purposes only. Modification can be made, particularly with regard to shape, size and arrangement of parts, within the scope of the invention as defined by the appended claims. For example, the control openings could be selectively closeable. Alternatively, the control openings could be of different sizes. For a further example, more than two concentric grooves could be utilized in order to provide greater flexibility in selection of the appropriate vacuum force.

We claim:

1. A pick and place device for efficiently picking up electronic components of widely varying sizes and shapes and placing the components as desired on a substrate, said device comprising:
    a spindle, said spindle includes a nozzle body surrounding a concentric inner sleeve, said inner sleeve having a substantially funnel-shaped nozzle tip disposed at its lower end and said spindle further includes a central vacuum channel formed in said inner sleeve;
    a first vacuum means coupled to said spindle for creating a first vacuum pressure;
    a second vacuum means coupled to said spindle for creating a second vacuum pressure greater than said first vacuum pressure, said first vacuum means facilitating pick-up of smaller electronic components and said second vacuum means facilitating pick-up of larger electronic components;
    wherein said first vacuum means generates a first vacuum area A1 and said second vacuum means generates a second vacuum area A2, said second vacuum area A2 being substantially concentric to said first vacuum area A1; and
    an outer cushion disposed between the lower end portion of said nozzle body and said nozzle tip, said outer cushion forming a chamber between said outer cushion and said nozzle tip, said chamber corresponding to said vacuum area A2 and the inner diameter of said nozzle tip corresponding to said vacuum area A1.

2. A device as in claim 1, further comprising at least one control orifice formed in the side wall of said nozzle tip.

3. A device as in claim 2, wherein, said control orifice is selectively openable to select either said first vacuum area A1 or said second vacuum area A2.

4. A device as in claim 2, wherein there are at least two control orifices of different sizes.

5. A spindle for a pick and place device for efficiently picking up electronic components of widely varying sizes and shapes and placing the components as desired on a substrate, said spindle comprising:
    a nozzle body surrounding a concentric inner sleeve, said inner sleeve having a component engaging nozzle tip generally defining a first area; and
    a first vacuum means, communicating with a vacuum channel to said inner sleeve, for creating a first vacuum pressure over said first area;
    a second vacuum means, communicating with said channel, for creating a second vacuum pressure over a second area generally concentric with said first area, said first area facilitating pick-up of smaller electronic components and said second area facilitating pick-up of larger electronic components;
    a member of compressible material surrounding said tip and radially spaced therefrom so as to define a chamber therebetween corresponding to said second vacuum means.

6. A spindle as in claim 5, and further comprising:
    a vacuum seal for said larger components, said seal comprising said compressible member.

7. A spindle as in claim 5, and further comprising:
    means for cushioning said components during pick and place and comprising a compressible material.

* * * * *